(12) United States Patent
Yang

(10) Patent No.: US 10,985,271 B2
(45) Date of Patent: Apr. 20, 2021

(54) HIGH ELECTRON MOBILITY TRANSISTOR WITH IMPROVED BARRIER LAYER

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/411,053

(22) Filed: May 13, 2019

(65) Prior Publication Data

US 2020/0328298 A1 Oct. 15, 2020

(30) Foreign Application Priority Data

Apr. 15, 2019 (CN) .......................... 201910298721.8

(51) Int. Cl.
*H01L 29/778* (2006.01)
*H01L 21/02* (2006.01)
*H01L 29/205* (2006.01)
*H01L 29/40* (2006.01)
*H01L 29/417* (2006.01)
*H01L 29/423* (2006.01)
*H01L 29/66* (2006.01)

(52) U.S. Cl.
CPC ...... *H01L 29/7787* (2013.01); *H01L 21/0254* (2013.01); *H01L 21/02639* (2013.01); *H01L 29/205* (2013.01); *H01L 29/401* (2013.01); *H01L 29/41775* (2013.01); *H01L 29/4236* (2013.01); *H01L 29/42364* (2013.01); *H01L 29/66462* (2013.01)

(58) Field of Classification Search
CPC .................................................. H01L 29/7787
USPC ........................................................... 257/76
See application file for complete search history.

(56) References Cited

U.S. PATENT DOCUMENTS

| 8,633,094 | B2 | 1/2014 | Ramdani et al. | |
|---|---|---|---|---|
| 2014/0094223 | A1* | 4/2014 | Dasgupta | H01L 23/535 455/566 |
| 2014/0252370 | A1 | 9/2014 | Kwak | |
| 2017/0345922 | A1* | 11/2017 | Iucolano | H01L 21/02458 |
| 2020/0144369 | A1* | 5/2020 | Lin | H01L 27/1203 |

FOREIGN PATENT DOCUMENTS

WO 2018/004660 1/2018

* cited by examiner

*Primary Examiner* — Ajay Arora
(74) *Attorney, Agent, or Firm* — Winston Hsu

(57) ABSTRACT

A method for fabricating high electron mobility transistor (HEMT) includes the steps of: forming a buffer layer on a substrate; forming a first barrier layer on the buffer layer; forming a patterned mask on the first barrier layer; forming a second barrier layer adjacent to two sides of the patterned mask; removing the patterned mask to form a recess; forming a gate electrode in the recess; and forming a source electrode and a drain electrode adjacent to two sides of the gate electrode.

11 Claims, 6 Drawing Sheets

HIGH ELECTRON MOBILITY TRANSISTOR WITH IMPROVED BARRIER LAYER

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating high electron mobility transistor (HEMT) includes the steps of: forming a buffer layer on a substrate; forming a first barrier layer on the buffer layer; forming a patterned mask on the first barrier layer; forming a second barrier layer adjacent to two sides of the patterned mask; removing the patterned mask to form a recess; forming a gate electrode in the recess; and forming a source electrode and a drain electrode adjacent to two sides of the gate electrode.

According to another aspect of the present invention, a high electron mobility transistor (HEMT) includes: a buffer layer on a substrate; a first barrier layer on the buffer layer; a gate electrode on the first barrier layer; a second barrier layer adjacent to two sides of the gate electrode; and a source electrode and a drain electrode adjacent to two sides of the gate electrode on the second barrier layer. Preferably, the first barrier layer and the second barrier comprise different concentrations.

According to yet another aspect of the present invention, a high electron mobility transistor (HEMT) includes: a buffer layer on a substrate; a barrier layer on the buffer layer; agate dielectric layer on the barrier layer; a work function metal layer on gate dielectric layer; a gate electrode on the work function metal layer; and a source electrode and a drain electrode adjacent to two sides of the gate electrode. Preferably, the work function metal layer comprises a p-type metal oxide layer.

These and other objectives of the present invention will no doubt become obvious to those of ordinary skill in the art after reading the following detailed description of the preferred embodiment that is illustrated in the various figures and drawings.

DETAILED DESCRIPTION

Referring to the FIGS. 1-4, FIGS. 1-4 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HYPE) process, or combination thereof.

Next, a first barrier layer 16 is formed on the surface of the buffer layer 14. In this embodiment, the first barrier layer 16 is preferably made of III-V semiconductor such as aluminum gallium nitride ($Al_xGa_{1-x}N$), in which 0<x<1, x being less than or equal to 20%, the first barrier layer 16 preferably includes an epitaxial layer formed through epitaxial growth process. Similar to the buffer layer 14, the formation of the first barrier layer 16 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HYPE) process, or combination thereof.

Figure 1:
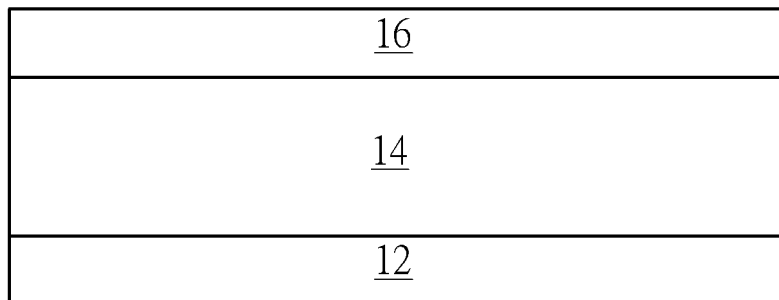
FIGS. 1-4 illustrate a method for fabricating a HEMT according to an embodiment of the present invention.
Figure 2:
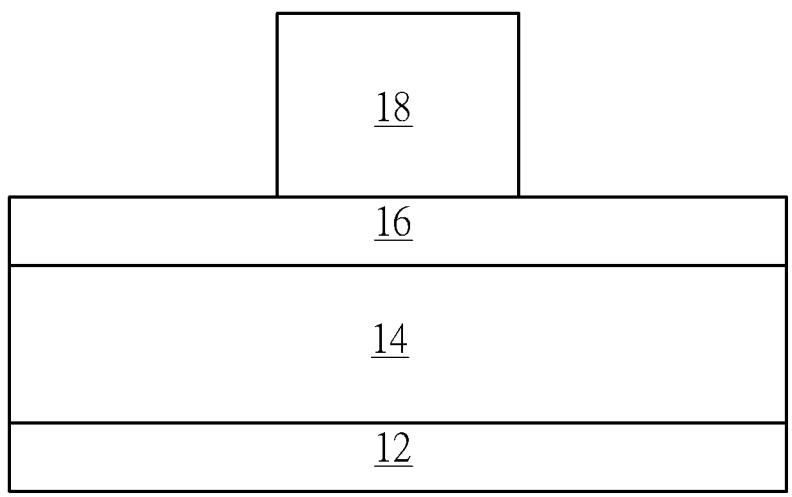

Next, as shown in FIG. 2, a patterned mask 18 is formed on the first barrier layer 16. In this embodiment, the formation of the patterned mask 18 could be accomplished by depositing a dielectric material such as silicon nitride on the surface of the first barrier layer 16, and an etching process is conducted by using another patterned mask (not shown) as mask to remove part of the dielectric material to form a patterned mask 18 on the surface of the first barrier layer 16.

Figure 3:
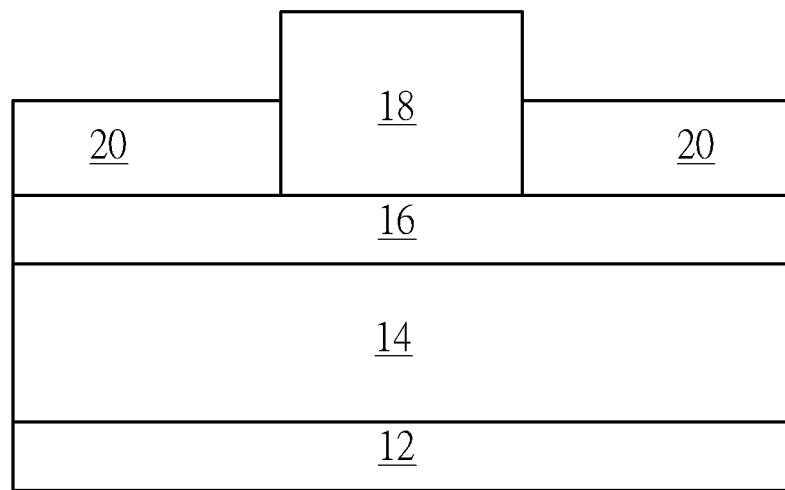

Next, as shown in FIG. 3, a second barrier layer 20 is formed adjacent to two sides of the patterned mask 18. In this embodiment, the first barrier layer 16 and the second barrier layer 20 are preferably made of same material such that the second barrier layer 20 is also made of III-V semiconductor such as aluminum gallium nitride ($Al_xGa_{1-x}N$), in which 0<x<1. It should be noted that the first barrier layer 16 and the second barrier layer 20 preferably include different concentrations of Al or more specifically the concentration of Al of the first barrier layer 16 is less than the concentration of Al of the second barrier layer 20. For instance, in contrast to the x value of Al of the first barrier layer 16 being less than or equal of 20%, the second barrier layer 20 if including III-V semiconductor such as aluminum gallium nitride ($Al_xGa_{1-x}N$), in which 0<x<1, the x value is preferably greater than 20% and less than 40%.

Moreover, the thickness of the first barrier layer 16 is preferably less than the thickness of the second barrier layer 20, in which the thickness of the first barrier layer 16 is preferably less than 10 nm or most preferably at 6 nm while the thickness of the second barrier layer 20 is preferably between 10-15 nm. Similar to the formation of the first barrier layer 16, the formation of the second barrier layer 20 adjacent to two sides of the patterned mask 18 and on top of the first barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HYPE) process, or combination thereof.

Figure 4:
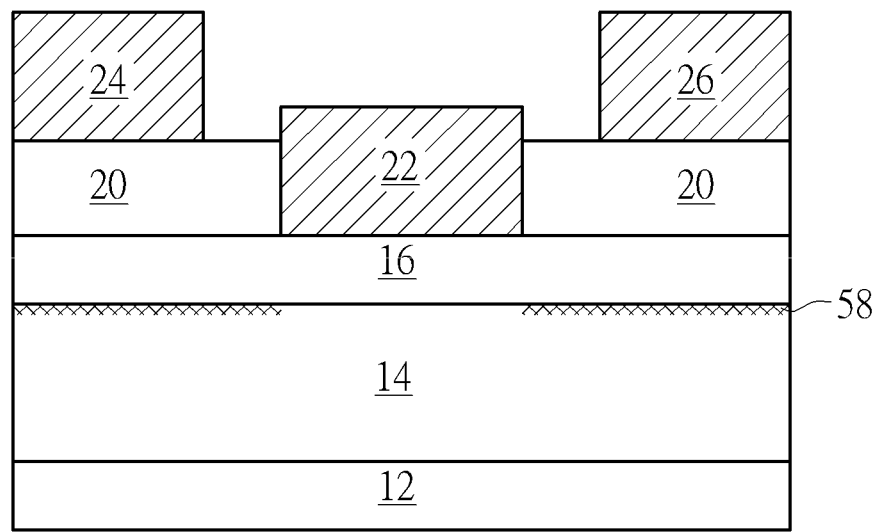

Next, as shown in FIG. 4, it would be desirable to first remove the patterned mask 18 to form a recess (not shown) between the second barrier layer 20, and then forming a gate electrode 22 in the recess and a source electrode 24 and a drain electrode 26 adjacent to two sides of the gate electrode 22. In this embodiment, the gate electrode 22, the source electrode, 24, and the drain electrode 26 are all made of metal material, in which the source electrode 24 and drain electrode 26 are preferably made of same material while the source electrode 24 and the drain electrode 26 and the gate electrode 22 could be made of same material or different materials. According to an embodiment of the present invention, each of the gate electrode 22, source electrode 24 and drain electrode 26 could include gold (Au), silver (Ag), platinum (Pt), titanium (Ti), aluminum (Al), tungsten (W), palladium (Pd), or combination thereof. According to other embodiments of the present invention, it would be desirable to conduct an electroplating process, sputtering process, resistance heating evaporation process, electron beam evaporation process, physical vapor deposition (PVD) process, chemical vapor deposition (CVD) process, or combination thereof to form electrode material in the recess and on the surface of the second barrier layer 20, and then pattern the electrode material through etching process to form the gate electrode 22, the source electrode 24, and the drain electrode 26 respectively.

It should be noted that since the gate electrode 22 is formed within the recess while the source electrode 24 and drain electrode 26 are formed on the surface of the higher second barrier layer 20 adjacent to two sides of the recess, the top surface of the gate electrode 22 is preferably higher than the top surface of the second barrier layer 20 on the adjacent two sides and lower than the top surfaces of the source electrode 24 and drain electrode 26. Moreover, despite the fact that the gate electrode 22 and the source electrode 24 and drain electrode 26 on adjacent two sides are formed at the same time or separately, the height of the gate electrode 22 could be equal to the height of each of the source electrode 24 and drain electrode 26, greater than the height of each of the source electrode 24 and drain electrode 26, or less than the height of each of the source electrode 24 and drain electrode 26, which are all within the scope of the present invention.

Figure 5:
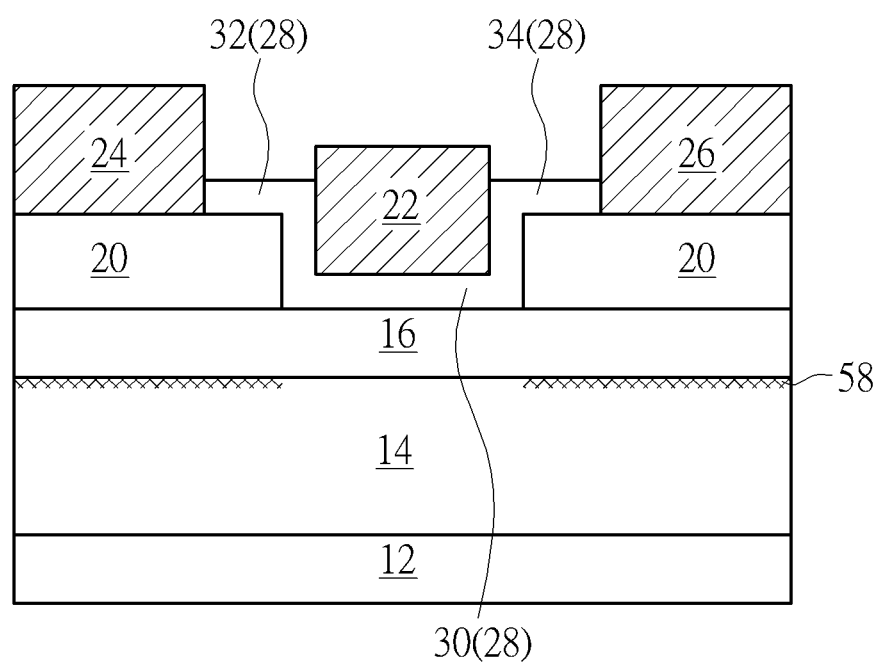
FIG. 5 illustrates a structural view of a HEMT applied to power device according to an embodiment of the present invention.

Referring to FIG. 5, FIG. 5 illustrates a structural view of a HEMT applied to power device according to an embodiment of the present invention. As shown in FIG. 5, in contrast to removing the patterned mask 18 to form a recess and then directly forming a gate electrode 22, source electrode 24, and drain electrode 26 as shown in FIG. 4, it would also be desirable to first form a gate dielectric layer 28 covering the surface of the second barrier layer 20 and filling part of the recess, conduct another photo-etching process to remove part of the gate dielectric layer 28 adjacent to two sides of the recess, and then follow the aforementioned process by forming a gate electrode 22 on the gate dielectric layer 28 disposed within the recess and a source electrode 24 and drain electrode 26 adjacent to two sides of the gate electrode 22. In this embodiment, the gate dielectric layer 28 is preferably disposed between the gate electrode 22 and the first barrier layer 16 and second barrier layer 20, in which the gate dielectric layer 28 includes a U-shape cross-section. Viewing from a more detailed perspective, the gate dielectric layer 28 further includes a U-shaped portion 30 disposed between the gate electrode 22 and the first barrier layer 16 and second barrier layer 20, a first horizontal portion 32 disposed on one side of the U-shaped portion 30 and contacting the source electrode 24 directly, and a second horizontal portion 34 disposed on another side of the U-shaped portion 30 and contacting the drain electrode 26 directly.

In this embodiment, the gate dielectric layer 28 could include $SiO_2$, silicon nitride (SiN), a high-k dielectric layer, or combination thereof, in which the high-k dielectric layer could be selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 6:
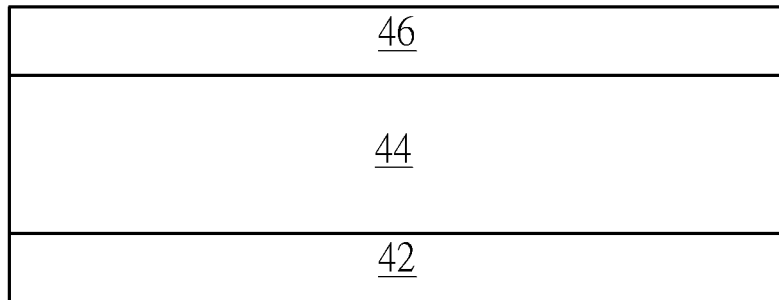
FIGS. 6-9 illustrate a method for fabricating HEMT according to an embodiment of the present invention.

Referring to FIGS. 6-9, FIGS. 6-9 illustrate a method for fabricating HEMT according to an embodiment of the present invention. As shown in FIG. 6, a substrate 42 such as a substrate made from silicon, silicon carbide, or aluminum oxide (or also referred to as sapphire) is provided, in which the substrate 42 could be a single-layered substrate, a multi-layered substrate, gradient substrate, or combination thereof. According to other embodiment of the present invention, the substrate 42 could also include a silicon-on-insulator (SOI) substrate.

Next, a buffer layer 44 is formed on the substrate 42. According to an embodiment of the present invention, the buffer layer 44 is preferably made of III-V semiconductors such as gallium nitride (GaN), in which a thickness of the buffer layer 44 could be between 0.5 microns to 10 microns. According to an embodiment of the present invention, the formation of the buffer layer 44 could be accomplished by a molecular-beam epitaxy (MBE) process, a metal organic chemical vapor deposition (MOCVD) process, a chemical vapor deposition (CVD) process, a hydride vapor phase epitaxy (HYPE) process, or combination thereof.

Next, a barrier layer 46 is formed on the surface of the buffer layer 44. In this embodiment, the barrier layer 46 is preferably made of III-V semiconductor such as aluminum gallium nitride ($Al_xGa_{1-x}N$), in which $0<x<1$ and the barrier layer 46 preferably includes an epitaxial layer formed through epitaxial growth process. Similar to the buffer layer 44, the formation of the barrier layer 46 on the buffer layer 44 could be accomplished by a molecular-beam epitaxy (MBE) process, a metal organic chemical vapor deposition (MOCVD) process, a chemical vapor deposition (CVD) process, a hydride vapor phase epitaxy (HYPE) process, or combination thereof.

Figure 7:
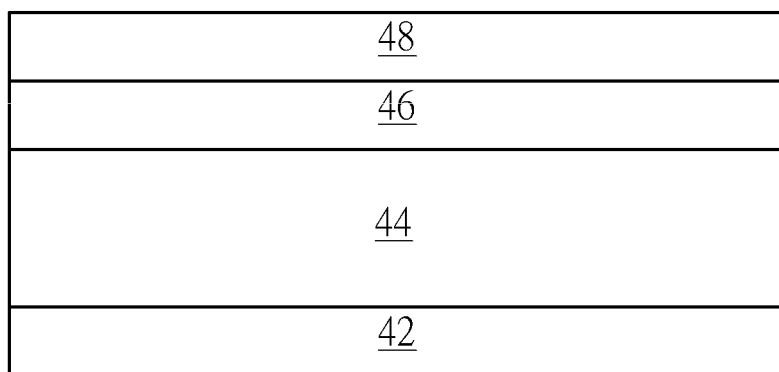

Next, as shown in FIG. 7, a gate dielectric layer 48 is formed on the surface of the barrier layer 46. In this embodiment, the gate dielectric layer 48 could include $SiO_2$, silicon nitride (SiN), a high-k dielectric layer, or combination thereof, in which the high-k dielectric layer could be selected from dielectric materials having dielectric constant (k value) largert than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 8:
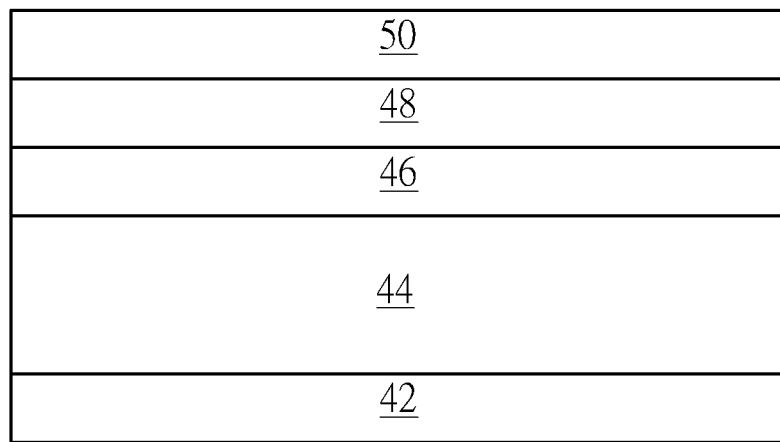

Next, as shown in FIG. 8, a work function metal layer 50 is formed on the surface of the gate dielectric layer 48, in which the work function metal layer 50 preferably includes a p-type metal oxide layer. Specifically, the work function metal layer 50 preferably includes magnesium zinc oxide (MgZnO), copper oxide (CuO), nickel oxide (NiO), chromium oxide ($Cr_2O_3$), cobalt oxide ($Co_3O_4$). manganese oxide ($Mn_3O_4$), or combination thereof. According to an embodiment of the present invention, the formation of the work function metal layer 50 could be used to lower current leakage of the gate electrode and control the threshold voltage of device. Moreover, as the work function metal layer 50 is formed by a low temperature growth process, the occurrence of crystallization under the gate dielectric layer 48 could be prevented after the work function metal layer 50 is formed.

Figure 9:
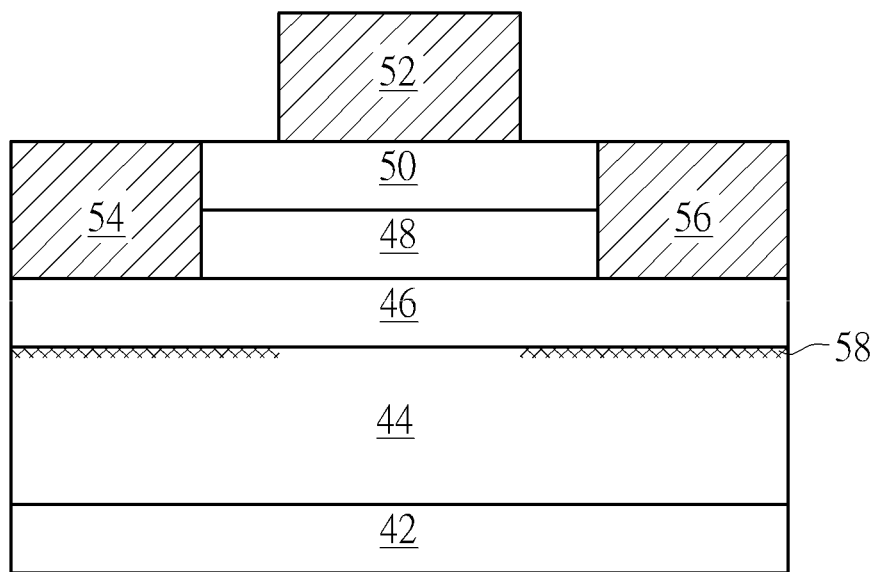

Next, as shown in FIG. 9, a pattern transfer process could be conducted by first using a patterned mask (not shown) to remove part of the work function metal layer 50 and part of the gate dielectric layer 48 to expose the surface of the barrier layer 46 on adjacent two sides, and then forming a gate electrode 52 on the work function metal layer 50 and a source electrode 54 and a drain electrode 56 adjacent to two sides of the gate electrode 52. Similar to the aforementioned embodiment, the gate electrode 52, the source electrode, 54, and the drain electrode 56 are all made of metal material, in which the source electrode 54 and drain electrode 56 are preferably made of same material while the source electrode 54 and the drain electrode 56 and the gate electrode 52 could be made of same material or different materials. According to an embodiment of the present invention, each of the gate electrode 52, source electrode 54 and drain electrode 56 could include gold (Au), silver (Ag), platinum (Pt), titanium (Ti), aluminum (Al), tungsten (W), palladium (Pd), or combination thereof. According to other embodiments of the present invention, it would be desirable to conduct an electroplating process, sputtering process, resistance heating evaporation process, electron beam evaporation process, physical vapor deposition (PVD) process, chemical vapor deposition (CVD) process, or combination thereof to form an electrode material on the surface of the work function metal layer 50 and barrier layer 46, and then pattern the electrode material through etching process to form the gate electrode 52, the source electrode 54, and the drain electrode 56 respectively.

Structurally, the top surfaces of the source electrode 54 and drain electrode 56 could be lower than, even with, or higher than the top surface of the work function metal layer 50 but slightly lower than the top surface of the gate electrode 52, the height of each of the source electrode 54 and drain electrode 56 could be equal to, less than, or greater than the height of the gate electrode 52, and the width of the gate electrode 52 is preferably less than the width of the work function metal layer 50 and/or width of the gate dielectric layer 48. It should be noted that even though the gate dielectric layer 48 pertains to be a single-layered structure in this embodiment, according to an embodiment of the present invention, the gate dielectric layer 48 could also be a composite structure further including an interfacial layer made of silicon oxide and a high-k dielectric layer disposed on the surface of the interfacial layer. In other words, the gate dielectric layer 48 made of both interfacial layer and high-k dielectric layer and the work function metal layer 50 together constitute a tri-layered structure sandwiched between the barrier layer 46 and the gate electrode 52. According to yet another embodiment of the present invention, if the gate dielectric layer 48 were to include at least a high-k dielectric layer and/or a metal oxide layer, the metal oxide layer within the gate dielectric layer 48 and the metal oxide layer 50 above are preferably made of different materials.

Figure 10:
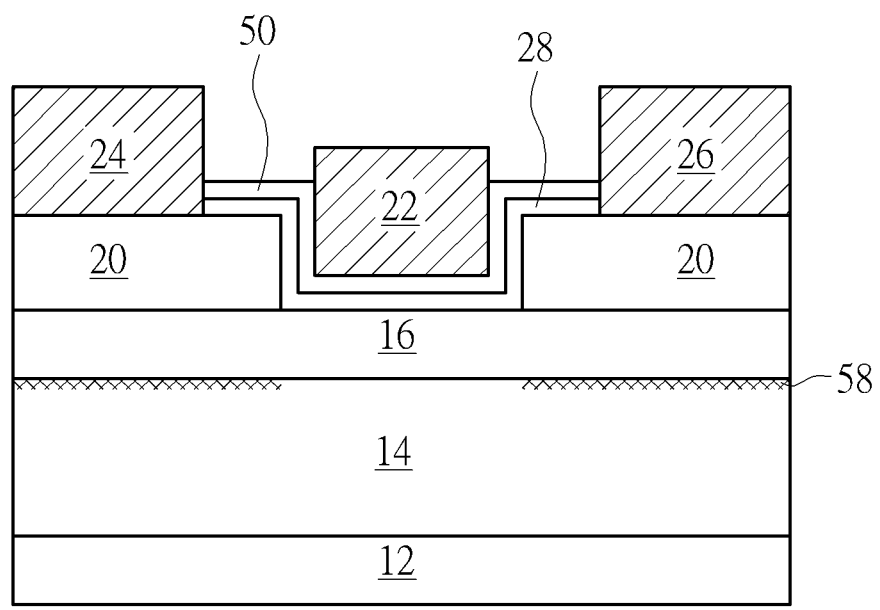
FIG. 10 illustrates a structural view of a HEMT according to an embodiment of the present invention.

Referring to FIG. 10, FIG. 10 illustrates a structural view of a HEMT according to an embodiment of the present invention. As shown in FIG. 10, it would also be desirable to combine the structure shown in FIG. 5 with the process of forming a work function metal layer on the gate dielectric layer as shown in FIG. 8 to obtain another structure. For instance, it would be desirable to first form a gate dielectric layer 28 as shown in FIG. 5, form a work function metal layer 50 from FIG. 8 on the surface of the gate dielectric layer 28, conduct another photo-etching process to remove part of the work function metal layer 50 and part of the gate dielectric layer 28 adjacent to two sides of the recess, and then following the aforementioned process to form a gate electrode 22 on the work function metal layer 50 in the recess and a source electrode 24 and drain electrode 26 adjacent to two sides of the gate electrode 22. Preferably, the work function metal layer 50 and the work function metal layer from the aforementioned embodiment are made of same material. Moreover, since the work function metal layer 50 and the gate dielectric layer 28 are patterned at the same time, the two layers 28, 50 preferably share same cross-section profile. For instance, each of the layers 28, 50 preferably include the aforementioned U-shaped portion and two horizontal portions connected to two sides of the U-shaped portion, and the details of which are not repeated herein for the sake of brevity.

Similar to the embodiment shown in FIG. 9, even though the gate dielectric layer 28 shown in FIG. 10 pertains to be a single-layered structure, according to another embodiment of the present invention, the gate dielectric layer 28 could be a composite structure further including an interfacial layer made of silicon oxide disposed on the surface of the first barrier layer 16 and a high-k dielectric layer disposed on the surface of the interfacial layer. In other words, the gate dielectric layer 28 made of both interfacial layer and high-k dielectric layer and the work function metal layer 50 together constitute a tri-layered structure sandwiched between the first barrier layer 16 and the gate electrode 22. According to yet another embodiment of the present invention, if the gate dielectric layer 28 were to include at least a high-k dielectric layer and/or a metal oxide layer, the metal oxide layer within the gate dielectric layer 28 and the metal oxide layer 50 above are preferably made of different materials.

Typically, as shown in FIGS. 4, 5, 9, 10, a heterojunction is formed at the interface between the buffer layer and barrier layer as a result of the bandgap difference between the two layers. Essentially a quantum well is formed in the banding portion of the conduction band of the heterojunction to constrain the electrons generated by piezoelectricity so that a channel region 58 or two-dimensional electron gas (2DEG) is formed at the junction between the buffer layer and barrier layer to form conductive current.

In contrast to the conventional approach of using etching process to remove part of the barrier layer and even part of the channel region to form a recess and then form a gate electrode in the recess to fabricate enhanced mode HEMT device, the embodiment of the present invention from FIGS. 1-4 preferably forms a patterned mask 18 on the first barrier layer 16 to define the location of the gate electrode formed afterwards, forms a second barrier layer 20 adjacent to two sides of the patterned mask 18, and then forms the gate electrode 22, source electrode 24, and drain electrode 26 after removing the patterned mask 18 to form a recess. By using this approach it would be desirable to prevent etching process from damaging the region directly under the gate electrode while removing the barrier layer thereby affecting the threshold voltage of the device as found in conventional art.

Moreover, the present invention not only adjusts the thickness of the first barrier layer 16 and second barrier layer 20 directly under and adjacent to two sides of the gate electrode 22, but also adjusts the concentration of Al in the second barrier layer 20 adjacent to two sides of the gate electrode 22 so that the operation of the HEMT is switched from "normally on" to "normally off". Specifically, the present invention lowers the thickness of the first barrier layer 16 directly under the gate electrode 22 and increases the thickness of the second barrier layer 20 adjacent to two sides of the gate electrode 22, in which the thickness of the first barrier layer 16 directly under the gate electrode 22 is controlled under 10 nm while the thickness of the second barrier layer 20 is between 10-15 nm. Meanwhile, the concentration of Al within the first barrier layer 16 is adjusted to be lower than the concentration of Al within the second barrier layer 20. By doing to, the 2DEG directly under the gate electrode 22 could be reduced to achieve a "normally off" operation mode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a buffer layer on a substrate;
   a first barrier layer on the buffer layer;
   a gate electrode on the first barrier layer;
   a second barrier layer adjacent to two sides of the gate electrode and on the first barrier layer, wherein the gate electrode directly contacts a top surface of the first barrier layer and sidewalls of the second barrier layer and the first barrier layer and the second barrier comprise different concentrations; and
   a source electrode and a drain electrode adjacent to two sides of the gate electrode on the second barrier layer.

2. The HEMT of claim 1, wherein the first barrier layer and the second barrier layer comprise $Al_xGa_{1-x}N$.

3. The HEMT of claim 2, wherein a concentration of Al of the first barrier layer is less than a concentration of Al of the second barrier layer.

4. The HEMT of claim 1, wherein a thickness of the first barrier layer is less than a thickness of the second barrier layer.

5. The HEMT of claim 1, further comprising a gate dielectric layer between the gate electrode and the first barrier layer.

6. The HEMT of claim 5, wherein the gate dielectric layer comprises a U-shape.

7. A high electron mobility transistor (HEMT), comprising:
   a buffer layer on a substrate;
   a barrier layer on the buffer layer;
   a gate dielectric layer on the barrier layer;
   a work function metal layer on gate dielectric layer, wherein the work function metal layer comprises a p-type metal oxide layer;
   a gate electrode on the work function metal layer; and
   a source electrode and a drain electrode adjacent to two sides of the gate electrode, wherein the source electrode contacts sidewalls of the gate dielectric layer and the work function metal layer directly.

8. The HEMT of claim 7, wherein the buffer layer comprises a group III-V semiconductor.

9. The HEMT of claim 7, wherein the buffer layer comprises gallium nitride (GaN).

10. The HEMT of claim 7, wherein the barrier layer comprises $Al_xGa_{1-x}N$.

11. The HEMT of claim 7, wherein a width of the gate electrode is less than a width of the work function metal layer.

* * * * *